United States Patent [19]

Parks, III et al.

[11] 4,315,321

[45] Feb. 9, 1982

[54] METHOD AND APPARATUS FOR ENHANCING THE CAPABILITIES OF A COMPUTING SYSTEM

[75] Inventors: William L. Parks, III, Bethesda, Md.; Clifford Harwood, Wheaton, Ill.

[73] Assignee: The Kardios Systems Corporation, Gaithersburg, Md.

[21] Appl. No.: 916,255

[22] Filed: Jun. 16, 1978

[51] Int. Cl.³ .............................................. G06F 9/26
[52] U.S. Cl. .................................................... 364/900
[58] Field of Search ... 364/200 MS File, 900 MS File, 364/715

[56] References Cited

U.S. PATENT DOCUMENTS

| | | | |
|---|---|---|---|
| 3,374,466 | 3/1968 | Hanf et al. | 364/200 |
| 3,646,522 | 2/1972 | Furman et al. | 364/200 |
| 3,659,275 | 4/1972 | Marshall | 364/200 X |
| 3,751,645 | 8/1973 | Brandsma et al. | 364/300 X |
| 3,872,452 | 3/1975 | Stoops | 365/230 |
| 3,972,028 | 7/1976 | Weber et al. | 364/200 |
| 3,997,895 | 12/1976 | Cassonnet et al. | 364/200 |
| 4,040,029 | 8/1977 | Young | 364/900 |
| 4,117,536 | 9/1978 | Bodner | 364/200 |

OTHER PUBLICATIONS

Chang et al., "OP Code and Status Handling for Emulation", IBM Tech. Disc. Bull., vol. 14, No. 10, Mar. 1972, pp. 3074–3076.

Primary Examiner—Joseph M. Thesz
Assistant Examiner—Thomas M. Heckler
Attorney, Agent, or Firm—Fleit & Jacobson

[57] ABSTRACT

A method and apparatus for permitting an existing computing system to understand and operate upon applications programming, which has been prepared using the instruction set of another computing system. Selected memory units located in the central processing unit of the existing computing system are removed and apparatus containing a circuit is inserted into the electrical connections previously occupied by such memory units. The inventive circuit contains advanced microcircuits which provide additional memory capability for containing an inventive microprogram which contains the instruction set of the computing system being emulated. The invention, after installation, permits an existing computing system to operate on applications programming written either in its original language or in the language of the machine being emulated.

5 Claims, 4 Drawing Figures

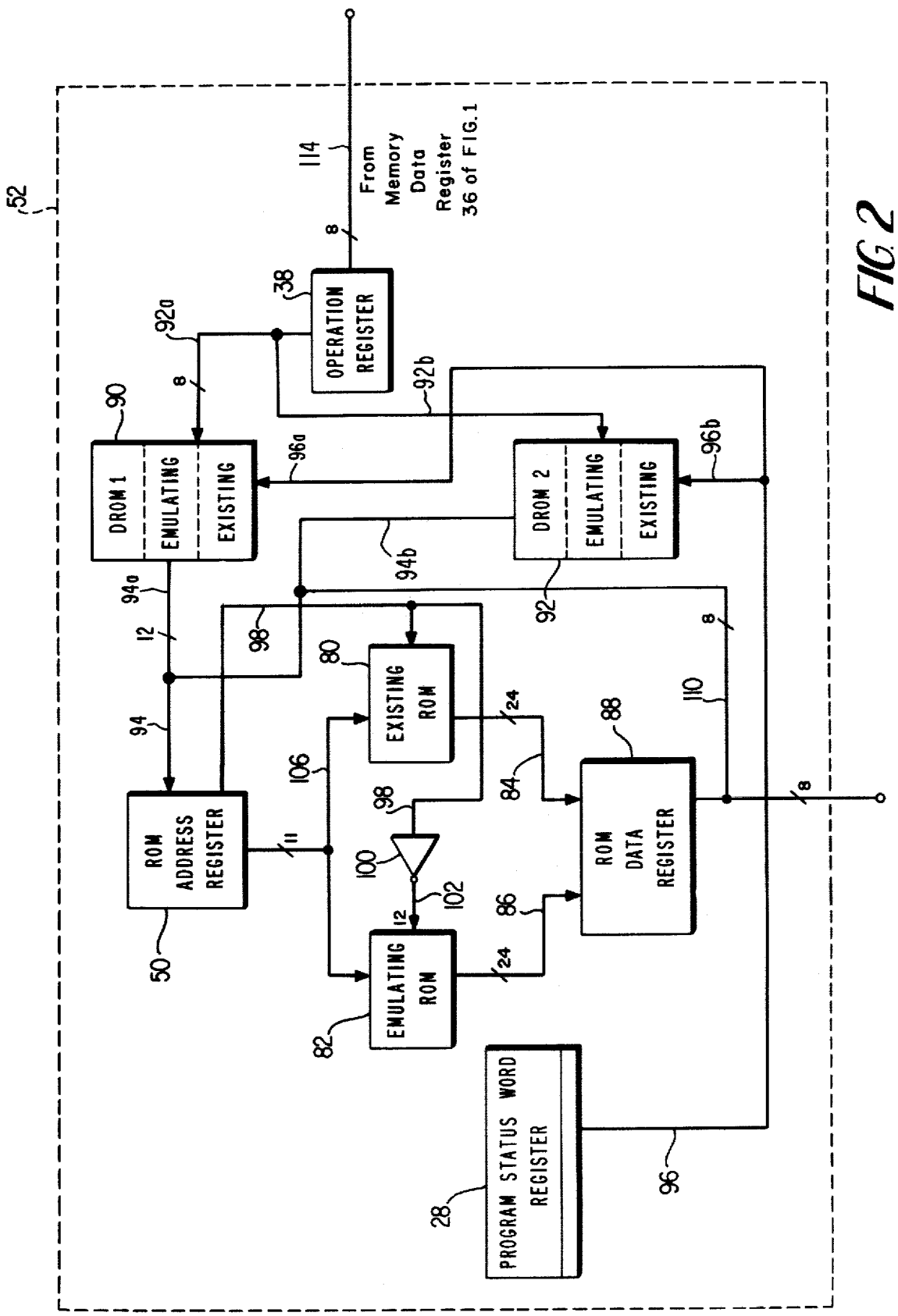

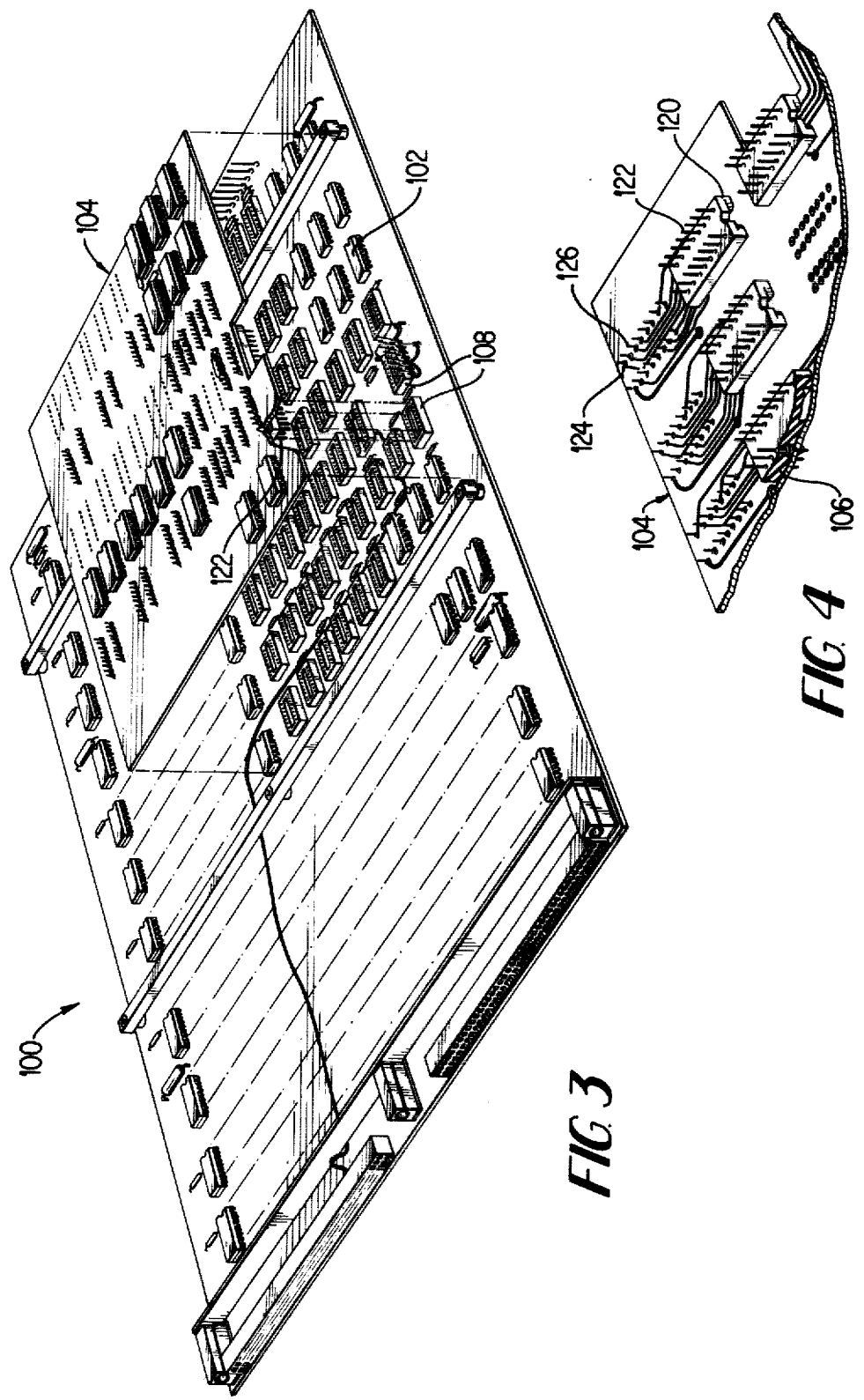

METHOD AND APPARATUS FOR ENHANCING THE CAPABILITIES OF A COMPUTING SYSTEM

BACKGROUND OF THE INVENTION

The present invention relates to computing systems and, more specifically, relates to minicomputers which may be adapted and enhanced to permit them to operate with applications programming in a language other than that for which they were orginally designed.

As it often happens in American industry, one corporation emerges as being the preeminent one in a specific area of technology. This has been the case, in a well-chronicled rise, whereby International Business Machines (IBM) has obtained the overwhelming leadership in the field of computing systems and data processing equipment. For example, in the case of the IBM series 370/360 systems, it has been estimated that there are now 50,000 such units installed and operating worldwide. The majority of this number are located in the United States.

It is, of course, obvious that such computing systems represent to the user a substantial investment in hardware, what may not be quite as obvious is that an additional investment, frequently much greater than the initial investment, is also required. This additional investment is for the software which is required in order to use such hardware. This software is frequently termed applications programming. Applications programming may be generated by the user himself or may be supplied by independent contractors, sometimes termed "software houses". In this regard, the situation often arises wherein, after a user has made a substantial investment in the applications programming, he then becomes almost inexorably linked with the hardware manufacturer who produced the initial system, in this example, IBM. This is so because, if the user elects to switch to a computing system which is not compatible with his original choice, the cost to convert the already prepared software is prohibitive.

There have been at least two different approaches taken in an attempt to alleviate this requirement to continue with the originally chosen line of equipment. Such approaches, of course, have been advanced by competitors of IBM, in order to attempt to obtain a portion of this vast computer hardware market. The first such approach has been to provide "plug-compatible" hardware and its attendant software. In other words, these systems require no change to be made in either the applications software, the operating systems, or the peripheral hardware, since the user can literally unplug the original hardware and plug in the new hardware. It then becomes a simple matter to load the user's program into the hardware and run the applications program. A major problem or obstacle in the plug-compatible approach is that the new hardware frequently costs almost the same as the original hardware, which it is intended to replace. Accordingly, there is some market resistance to changing brands for only a minimum hardware cost savings and a slight increase in performance.

A second approach in attempting to obtain a portion of the hardware market has been to offer a nonplug-compatible system, which will execute the identical applications programs, using the language (instruction set) of the original hardware. Such nonplug-compatible systems must therefore contain some means to translate the original instruction into the language of the new system. This type of computing system is generally termed an emulator. Once again, in order to make this type of system attractive in the marketplace, a substantial price differential from the original computing system is required and, as may be expected, any such price differential involves some performance tradeoffs. Such performance tradeoffs may be frequently found in the necessity to have the user convert portions of the applications programming code in order to make the system workable. It is this second approach which has been followed by the present invention and the manner in which this is achieved will become evident from the following description of the invention.

Accordingly, it is a principal object of the present invention to provide a method and apparatus for adapting and enhancing an existing computing system so as to permit it to execute applications programming written in a language (instruction set) of a different computing system.

SUMMARY OF THE INVENTION

In order to provide emulation of a computing system and its individual programming language, the present invention adapts an existing minicomputer system by means of a specialized circuit board so that the minicomputer will then totally emulate a different original-equipment computing system. In practicing the present invention then, one must first choose an existing minicomputer, for example, the Interdata 7/32 minicomputer. The present invention teaches the removal of selected portions of the minicomputer hardware and the adaptation of the circuits, so that new read only memory units, containing the desired microprogram, can be plugged in. This provides a complete microcode emulation of an original hardware system, such as in this example, the IBM 370/360 Series.

By judiciously choosing an existing minicomputer for adaptation, the present invention permits the inherent advantages of such minicomputing system to remain in the final system, while providing the extra advantage of having a system compatible with two different instruction sets. This is made possible by exploiting to advantage the most recent advances in semi-conductor technology. More specifically, since there must necessarily be substantial periods of time between the date of original conception, the design of the computing system, and its actual entry into the commercial marketplace, it is not infrequently the case that during this time period, the semi-conductor industry will make significant advances as far as device size, capabilities, and capacity are concerned. In this regard, the present invention exploits these advances in the semi-conductor industry by adapting an existing minicomputer, which in all likelihood has been designed at least eighteen months prior to its entry into the marketplace, to accept the most modern and advanced individual semi-conductor devices. In this manner, the present invention permits the chosen minicomputer to achieve not only the original objective of emulating a different instruction set, as utilized by a different major hardware supplier, but also to permit the program language of the minicomputer, i.e., the original instruction set, to remain operational. Therefore, the present invention utilizes the rapidly advancing semi-conductor industry to its own advantage by enhancing older computing systems which were designed before the present crop of semi-conductors were made available. As mentioned, such utilization also provides a bimodal machine, which has two sets of read only memory, which contain the two separate languages in microcode.

Accordingly, the present invention enhances the existing minicomputer by providing a circuit board which may be inserted into the original minicomputer, after removal of certain of the read only memory (ROM) chips. These ROMs may contain, for example, a portion of the original microcode of the minicomputer. The present invention then provides a small circuit board termed a "daughter board" which has arranged on one side thereof, a plurality of read only memories (ROMs) and decode read only memories (DROMs), which contain the microcode of the system to be emulated. On the other side of this board are arranged pins or plugs, which are compatible with the circuit connections of the original read only memory units, whereby the daughter board may be plugged into the original or "mother" board to provide the desired increase in performance.

Accordingly, it is an object of the present invention to provide a method for enhancing and enlarging the capabilities of an existing minicomputer system such that it can emulate the instruction set of still another computing system.

Another object of the present invention is to provide apparatus for adapting an existing minicomputer system to provide it to emulate a different instruction set of another existing computing system.

It is a further object of the present invention to provide apparatus for enhancing the capabilities of an existing minicomputer system so that such system can operate either with its own original instruction set or with the instruction set of another computing system to be emulated.

It is still a further object of the present invention to provide a circuit board which can plug into the sockets vacated by memory units which have been removed from an existing minicomputer, whereby the additional circuit board provides a new emulation program capability to the minicomputer.

The manner in which these and other objects are accomplished by the present invention will become more apparent from the following detailed description of the present invention.

BRIEF DESCRIPTION OF THE DRAWINGS

FIG. 2 is a portion of the block diagram of the minicomputer of FIG. 1 having the present invention installed therein.

FIG. 3 is a perspective view of a circuit board containing a portion of the computing system of FIG. 2 showing the present invention mounted thereon by means of an additional circuit board.

FIG. 4 is a perspective view of a portion of the circuit board provided by the present invention.

DETAILED DESCRIPTION OF THE PRESENT INVENTION

Figure 1:
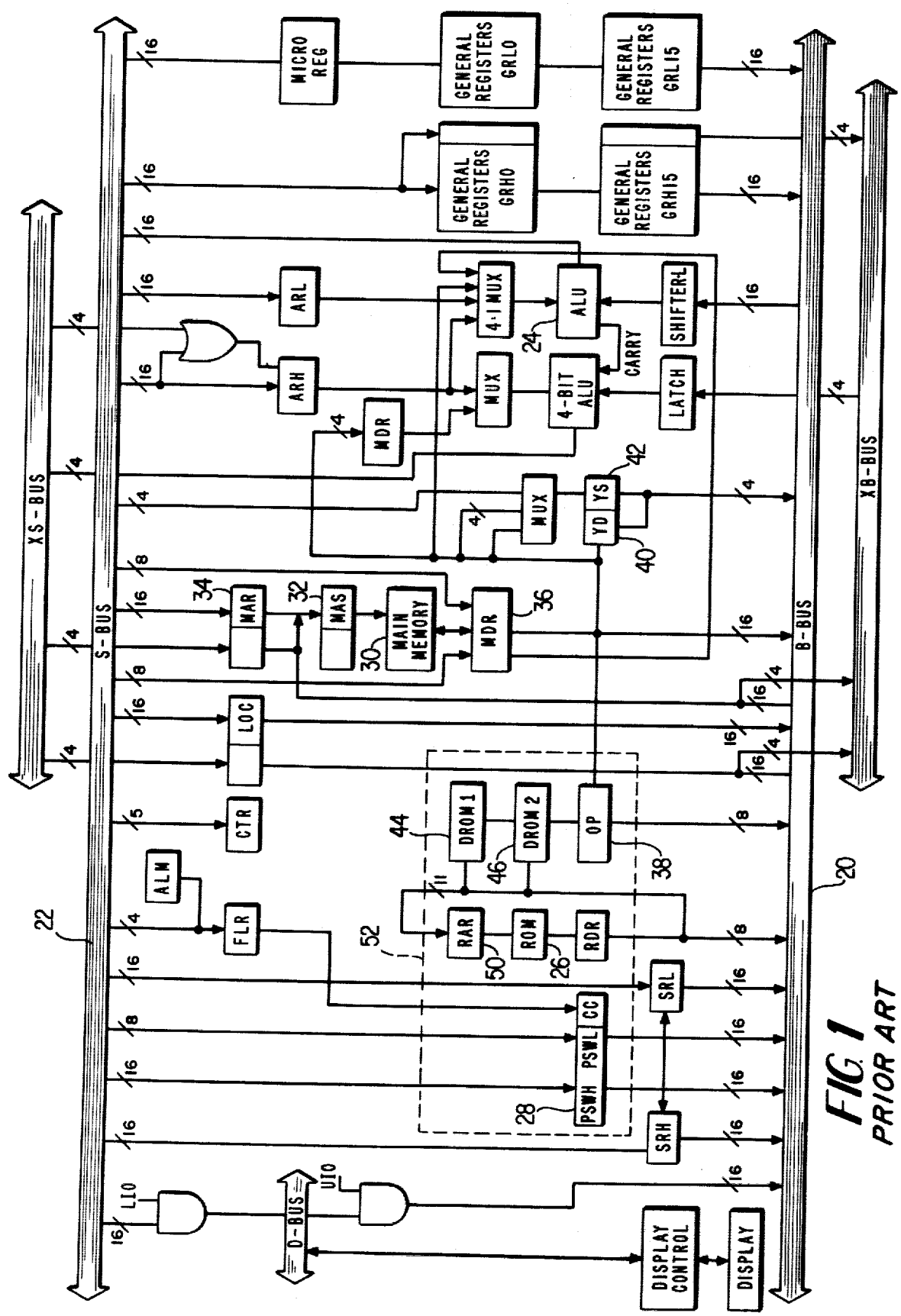
FIG. 1 is a schematic, in block diagram form, of a prior art minicomputer suitable for enhancement by the present invention.

Referring now to FIG. 1, a prior art minicomputer system is shown, which is suitable for use with the present invention. Of course, it should be understood that the minicomputer shown in FIG. 1 must be chosen to be architecturally similar to the system which is intended to be emulated. In this case, the system being emulated is an IBM 370/360 system and, accordingly, the minicomputer chosen must employ such concepts as program status word (PSW), condition codes, input/output operation by means of a selector channel or a multiplexer bus, and the like. In other words, for greater efficiency, the minicomputer selected should be as close as possible to the original equipment system being emulated. It is preferable that the minicomputer have the same word length as the system being emulated. In this case, the word length is 32 bits long. Also, it is preferable that the two computing systems employ the same number of user registers and, in this case, there are sixteen, general-purpose, 32-bit registers available.

The single most important feature of the minicomputer is that it must be microprogrammable. Microprogramming, as is well-known, is a means for implementing the control logic of a digital computer. The microprogram comprises microinstructions, which are stored in a read only memory (ROM) in the microprogram processor. Each microinstruction then attendantly causes one or more hardware functions to be performed. It is this series of microinstructions which is termed a microprogram. The present invention provides a microprogram, which functions as an emulator to cause the hardware of the minicomputer to react to a user's program stored in the main memory of the minicomputer, as well as to react to external events, in the exact manner as would a processor whose user instruction set is the same but whose hardware is completely different. In other words, microprogramming permits a user's instruction set to be executed on different hardware systems. Conversely, microprogramming permits different user instruction sets to be executed on the same hardware unit.

Referring now to FIG. 1, a minicomputer is shown organized between two 16-bit buses, 20 and 22. The bus 20 is used to present data to the arithmetic logic unit 24, and the bus 22 transfers the arithmetic logic unit output to the appropriate destination. The source and destination of data, on bus 20 and bus 22, as well as the functions performed by the arithmetic logic unit 24, are controlled by microinstructions contained in the read only memory (ROM) unit 26. The read only memory (ROM) in this minicomputer is a nondestructive memory containing seven pages of 256 words each. Each word is 24 bits long and represents one microinstruction. The minicomputer under analysis also employs a program status word unit 28, which is a 32-bit register, used to indicate the system status relative to the user program being operated. Bits 0 through 31 of the program status word (PSW) serve to define enabled interrupts, as well as the operational status of the user level processor. While some of the program status word bits have hardware significance, others are of significance only to the microprogram. Although 32 bits are provided, only 16 bits are implemented in the hardware of this particular prior art minicomputer and, more specifically, bits 16 through 27 represent the state of the machine, while bits 28 through 31 provide the condition code field to provide the results of the previous user instruction. This minicomputer employs a main memory 30, which consists of random access memory units, which provide storage for user instructions and data. In this minicomputer, the main memory 30 is addressed by a memory access register 32, which is automatically updated from a memory address register 34 at the start of each memory cycle. All data read to or from the main memory is first buffered in a memory data register 36.

The microprogram contained in ROM 26 initiates a main memory cycle by issuing a memory read, memory write, or instruction read command. After an instruction read has been issued, and the readout is available in the memory data register 36, bits 0 through 7 are placed in an operational register 38, bits 8 through 11 are placed in a second register 40, and bits 12 through 15 are placed in a third register 42. These registers, 38, 40, and 42 comprise an instruction register. The operational register 38 is utilized to address locations in a pair of decoder read only memories (DROMs) 44 and 46. Each of the decoder read only memories (DROMs) 44 and 46 contains 256 12-bit words. DROMs 44 and 46 are addressed by the operation code from the operational register 38. Each of the 256 possible bit combinations in the operation code addresses a unique word in the ROM 26. The eleven least significant bits of the first DROM 44 are fed on line 48, as inputs to a ROM Address Register (RAR) 50, and represent an address in the microprogram. The most significant bit indicates that a privileged instruction is decoded. DROM 46 is used exclusively to modify the contents of the RAR 50. DROMs 44 and 46 are accessed when the microprogram specifies such operation in the control field of the microinstruction.

The remaining units in the minicomputer under discussion here are of a conventional type and need not be explained further, since this minicomputer is but representative of that which is well-known to those skilled in the computer design art.

The area in FIG. 1, enclosed by the dashed line 52, is the circuit location in the existing minicomputer which will be enhanced by the present invention.

Referring now to FIG. 2, the portion of the minicomputer of FIG. 1, which was enclosed by the dashed line 52, is shown with the additional elements provided by the present invention having been added thereto. Generally speaking, these enhancements involve the areas relating to the program status word (PSW), the decoder read only memories (DROMs), and the read only memory (ROM) unit. In the present invention, one bit is redefined in the program status word, and additional portions are added to the decoder read only memories (DROMs) for decoding the operational codes of the machine to be emulated. An additional read only memory (ROM) is provided for storing the instruction set to be emulated, i.e., the microprogram. Also provided are conventional miscellaneous logic circuits, which support the new ROM and DROM portions.

As described above, by adding the inventive circuitry, the original minicomputer becomes a bimodal processor, with the particular mode being dependent upon the state of a particular bit of the program status word (PSW). For example, it bit 24 of the program status word (PSW) is reset when bit 27 of the program status word is set, then the operational code located in operational register 38 will be executed by the newly added emulation portions of the DROMs and by the emulation ROM. In the event that bit 24 of the program status word (PSW) is set, or bit 27 of the program status word is reset, then the operational code contained in the register 38 is executed by the original portions of DROMs 90 and 92 and by the microprogram which was originally contained in read only memory 26 of FIG. 1 (now in ROM 80).

It should be noted that, according to the present invention, the manner in which the microprocessor internally operates is identical in either of the two modes, i.e., either of the two instruction sets is used, with the only essential difference being that different portions of the decode read only memories (DROMs) and different read only memories (ROMs) are utilized.

Referring again to FIG. 2, the portion enclosed by the dashed line, 52 of FIG. 1 is shown with several of the original elements replaced by the advanced circuit elements provided by the present invention. More specifically, the original read only memory (ROM) 26 of FIG. 1, containing the microprogram of the existing minicomputer, has been replaced by a new read only memory arrangement formed in two sections, a first read only memory (ROM) 80 which serves to maintain the microprogram in the existing minicomputer, and a second read only memory (ROM) 82 which will contain the microprogram for the computing system to be emulated. This new read only memory arrangement is once again a highspeed, solid-state, nondestructive memory, organized in 16 pages of 256 words each. Each read only memory word is 24-bits long and represents one microinstruction. These microinstructions, from the appropriate ROM 80 or 82, are read out on multi-lines 84 or 86, respectively, each of which comprises 24 parallel lines. These multi-lines 84 and 86 are connected to a ROM data register (RDR) 88. It is understood, of course, that what is being read into the RDR 88 is, in fact, what was contained in ROM 80 or ROM 82, at the address specified by the ROM address register 50; however, the operation of the circuit of FIG. 2 will be described in more detail below.

The ROM Data Register (RDR) 88 is a 24-bit register which may be functionally described as a microinstruction register. The total of all of the microinstructions represents the instruction set of either the computing system being emulated or the existing minicomputer which is undergoing enhancement, and may be generally referred to as a microprogram. There are eight pages provided in each of ROMs 80 and 82. As indicated above, ROM 80 contains the original instruction set from the minicomputer undergoing enhancement and ROM 82 contains the microprogram of the computing system undergoing emulation.

The decode read only memory (DROM) units 44 and 46 of FIG. 1 have been replaced in the inventive system by DROMs 90 and 92, respectively. The DROMs 90 and 92 receive the Op-Code on lines 92a and 92b, respectively, from the operational register 38 and convert the Op-Code to an address in one or the other of the ROMs 80 or 82. This address is first fed to the ROM Address Register (RAR) 50 on the multi-line 94. It is, of course, understood that it is this address, in one or the other of the ROMs, that contains the microinstruction to carry out the task or operation specified by the Op-Code.

In the original minicomputer, as shown in FIG. 1 the DROMs 44 and 46 of FIG. 1, were contained in two units of 256 words by 12-bits, and were replaced, in accordance with the present invention, by two units of 512 words by 12-bits. In this manner, the DROM space has been effectively doubled. By applying the inventive method of replacing the existing semi-conductor units in a minicomputer with the most modern, state-of-the-art units, the existing DROMs were replaced by DROMs of the type known as dual density, which were selected so as to be compatible with the original DROMs. Dual density, of course, provides two times the capacity of the original device, with no additional chips being required. The additional address bit needed by the new DROMs to select which half of the two DROMs will be used, will be provided by the redefined bits in the program status word (PSW) register 28, i.e., bit number twenty-four in conjunction with bit number twenty-seven.

As indicated above, the program status word (PSW) register 28 is a 32-bit register, which is used to indicate the system status relative to the user's program being run. Some of the bits have hardware significance, while some of the bits are used only by the microprogram. In any event, the original minicomputer, as shown in FIG. 1, utilizes only sixteen of these bits. The present invention redefines the use of one of these bits and selects bit number twenty-four in the program status word (PSW) register 28 for use in determining which instruction set is to be executed. Bit twenty-four may be termed a mode bit and, if it is reset with bit twenty-seven being set, then the instruction set of the computing system being emulated, as contained in register 82, is executed; otherwise the original instruction set, as contained in the existing ROM 80, will be executed. This mode bit is fed out of the program status word (PSW) register 28 on lines 96, 96a and 96b to both of the DROMs 90 and 92, so as to provide the selection as described above.

As an example of the operation of the elements of FIG. 2, a basic user instruction cycle, which is the same regardless of which ROM, 80 or 82, has been selected, will now be discussed. After an instruction read command has been issued, bits 0 through 7 of the user instruction set, i.e., the Op-Code, are fed from the memory data register (MRDR) 36 of FIG. 1 to the operational register 38 via line 114. The operational register 38, which is an 8-bit register, is used to address the appropriate locations in the DROMs 90 and 92. The address constant "1" is jammed into the ROM address register 50, resulting in a branch to address number one in the ROM bank. When the microcode specifies decoding by the first DROM, the twelve bits of the DROM 90 are read out on multi-lines 94 and 94a, and are jammed into the ROM address register 50. This results in an automatic branch to an address, in the ROM bank, that is related to the user's Op-Code. The microinstruction at the location addressed by the DROM 90, as provided on line 94 to the ROM address register 50 and then to both of the ROMS 80 and 82 on multi-lines 106, is then read out from the appropriate ROM 80 or 82, which has been enabled by the most significant bit from the ROM address register 50, and is placed into the ROM Data Register 88 (RDR) on the twenty-four multi-lines 84 or 86, depending upon which ROM 80 or 82 has been enabled. The ROM Data Register (RDR) 88 is the instruction register for the microprocessor. The contents of the ROM Data Register (RDR) 88 are then decoded and used by the processor to execute the current microinstruction.

At the end of each machine cycle, the ROM address register 50 is incremented, the next microinstruction is fetched, and the process repeated, until the microprocessor issues a fetch new instruction command, at which point a new user's instruction is loaded into the operational register 38 from the main memory 30 of FIG. 1. If the microcode specifies decoding by the second DROM 92, the twelve bits of the second DROM 92 are read out on multi-lines 94 and 94b, and are jammed into the ROM address register 50. This results in the same actions taking place, as described above in reference to DROM 90. If the microcode represents a branch instruction, then the twelve least significant bits from the ROM data register 88 are jammed into the ROM address register 50 via line 110, thereby selecting a different address in one or the other of the ROMs 80 or 82.

Referring now to FIGS. 3 and 4, the physical or mechanical implementation of the inventive computing system enhancement is shown. The central processing unit board 100 of the existing minicomputer being enhanced is provided with a plurality of integrated circuit chips for performing the necessary arithmetic and logic functions. Such chips are shown typically at 102 and may be of the conventional dual inline package (DIP) configuration. In performing the enhancement provided by the present invention, it is, of course, necessary to expand the portion of the central processing unit containing the microcode memory, as well as to expand the decode read only memory (DROM) capabilities.

The original minicomputer contained seven pages of 256 words per page of read only memory (ROM) space, with each word being 24-bits long. In the physical implementation thereof, each page was composed of six rows of ROM units, each being 256 by 4 bits. Accordingly, it follows that the existing minicomputer requires forty-two read only memory (ROM) units, i.e., seven pages by six pages, to contain the original or existing microprogram. The decode read only memory (DROM) required seven read only memory (ROM) units with each being 256 by 4 bits. Therefore, in total, there were forty-nine integrated circuit chips required to contain the original microprogram and the decode read only memory (DROM) requirement. These forty-nine integrated circuit chips occupied approximately 25% of the area on the central processing unit board 100 of the original minicomputer. Because the microprogram or instruction set of the computer being emulated requires at least as much memory as, or more memory than, the existing microprogram, it is necessary to find some space on the existing board 100 to place the new microprogram. In other words, it is necessary to expand the existing microcomputer read only memory (ROM) space from seven pages of 256 words, 24 bits long, to sixteen pages of 256 words, 24 bits long. Additionally, it is also necessary, as seen from FIG. 2, to double the DROM space to accomodate the new emulating computing system Op-Codes.

The present invention provides a solution to the expanded read only memory requirement by exploiting the time lag between the time a minicomputer is designed and the time in which it is implemented and marketed. In other words, as mentioned above, by the time a computer has been implemented, the state of the art in semi-conductor manufacturing technology has advanced to a considerable degree. Accordingly, there are available semi-conductor devices which have an expanded capability over those which were available when the original computer was designed. Accordingly, the present invention teaches the replacement of the original 256 words by 4-bit read only memories (ROMs) (42 pieces) with 2,048 words by 4-bit read only memories (ROMs). This means that six read only memories (ROMs) can do the job of the original forty-two read only memories (ROMs), with the bonus that an additional eighth page, not previously employed, is now available for use. It may be seen that seven pages, having 256 words per page, equals 1,792 words or 42 chips, whereas in the newly provided read only memory (ROM), 8 pages by 256 words per page provides 2,048 words or six chips. Similarly, the original minicomputer employed seven DROMs of 256 words by 4-bits and these were replaced with dual density units, only recently made available, thereby providing 512 words times 4-bits or doubling the DROM space, with no additional chips being required. As indicated, the additional address bit needed by the new DROM is provided by the new bit in the program sequence word, i.e., bit 24. Of course, it is not possible to merely remove certain circuit elements from an existing logic board, such as the central processing unit under discussion, and insert the new semiconductor units in the original circuit. This situation would, of course, produce a non-working system. Accordingly, the present invention provides an auxiliary board 104, termed a "daughter" board, that plugs into the original board 100, and it is this daughter board 104 which contains the physical units of the ROMs and DROMs, as well as the miscellaneous conventional logic circuits which are required to support these new ROMs and DROMs.

Accordingly, the original minicomputer required forty-nine discrete ICs to generate seven pages of ROM space, whereas the present invention requires only twenty-two discrete ICs for sixteen pages of ROM space. Accordingly, the present invention provides an additional advantage in cutting down the thermal dissapation requirements, as well as reducing the number of spare components needed to maintain the inventive data processor.

As indicated, it is not possible to merely interchange integrated circuits, even though they are intended to perform similar functions. Accordingly, in solving the additional microprogram space problems, the present invention provides a method of electrically connecting the new circuits to the existing CPU board 100 and also provides a technique of physically mounting the daughter board 104 on the original board 100. The interconnection problem is additionally complicated since installation of the inventive enhancement circuits, which would be contained on the daughter board 104, requires in excess of sixty signal wires to be connected between the two boards. Obviously, from a manufacturing and maintenance standpoint, it is not practical to run sixty individual wires between the two boards. The present invention solves these problems by teaching the use of standard IC headers both to mount the daughter board and also to simultaneously provide the necessary electrical connections. In order to achieve this required expansion of capabilities, all of the ROMs and DROMs originally mounted in the existing minicomputer board 100 were first removed and replaced by low profile DIP package sockets. The use of these sockets provided three advantages inherent in the present design. First, it eliminated the forty-nine integrated circuit chips of the existing minicomputer. Second, approximately fifty of the required sixty electrical connections already existed on the pins in the sockets in board 100 and, therefore, by proper selection of these sockets for mating with the daughter board headers, fifty electrical connections could be made without the requirement for individual wires. Third, the header/socket mating provided a more than adequate physical mount for the daughter board, i.e., the daughter board was mechanically supported by the header/socket connection. The remaining electrical signals then require an additional low profile socket to be mounted on the central processing unit board 100 and the running of ten wires from the appropriate points on the board 100 to the new socket mounted thereon. In other words, the daughter board 104 is both mechanically mounted and electrically connected to the existing board 100 by means of fourteen headers which mate with thirteen existing ROMs and DROMs sockets on the board and with an additional socket which has been installed on the original board 100.

FIG. 4 then shows the portion of the daughter board 104, of FIG. 3, which board 104 has been removed for clarity. In this regard, the portion of daughter board 104 has been flipped over to show the bottom side thereof and, in particular, to show the mounting of the IC headers, shown typically at 120. Such headers are of the well known type and typically have sixteen or eighteen pins arranged in an upstanding manner from the bottom surface of the header. The pins are shown typically at 122. The headers are, of course, mounted in the printed circuit board 104 and are electrically mounted in the printed circuit connected to the appropriate integrated circuit chip by a technique conventional in printed circuits, i.e., a copper land which has been tinned with solder 126. As seen from FIG. 3, it is these pins 122 which are part of the headers 120 which mate with the integrated circuit DIP sockets, shown typically at 108 in FIG. 3.

It is understood, of course, that the foregoing description of the present invention is not intended to limit the scope thereof, except as in the appended claims.

What we claim is:

1. A bimodal processor for executing virtually simultaneously, on a time-shared basis, and without pre-processing, at least two microprograms, execution of each given one of said at least two microprograms defining a corresponding processing mode of said processor, said processor comprising:

a main memory containing a first microprogram including operational codes corresponding to a first distinct instruction set, data register means connected to said main memory for reading out said operational codes therefrom, first read only memory means for holding operational instructions from said first distinct instruction set to be executed by said processor, second read only memory means for holding a second microprogram comprising further operational instructions from a second distinct instruction set different from said first distinct instruction set, enabling means responsive to occurrence of each said corresponding processing mode of said processor for automatically issuing a selective enabling signal, and decode unit means responsive to said selective enabling signal for selectively converting said operational codes, read out from said main memory by said data register means, into either addresses of corresponding said operational instructions in said first read only memory means or addresses of corresponding said further operational instructions in said second read only memory means, and for selectively accessing either said corresponding operational instructions in said first read only memory means or said corresponding further operational instructions in said second read only memory means, whereby said bimodal processor automatically and switchably executes, without pre-processing, one of said first microprogram and said second microprogram in accordance with occurrence of respective said corresponding processing mode of said processor.

2. The processor of claim 1, wherein said enabling means for issuing a selective enabling signal comprises a program status word register having space therein for an additional enabling bit.

3. The processor of claim 1, wherein said decode unit means comprises at least one dual-density read only memory having segments for forming two discrete levels of operation of said decode unit means.

4. The processor of claim 1, wherein said decode unit means comprises at least one decoding read only memory for determining the addresses of said corresponding operational instructions in said first read only memory means and of said corresponding further operational instructions in said second read only memory means, and an address register connected to said at least one decoding read only memory for selectively accessing one of said first read only memory means and said second read only memory means in accordance with said determined addresses and said corresponding processing mode of said processor.

5. The processor of claim 1, further comprising operational code register means for receiving and holding said operational codes read out from said main memory by said data register means.

* * * * *